United States Patent [19]
Wu

[11] Patent Number: 6,100,127
[45] Date of Patent: Aug. 8, 2000

[54] SELF-ALIGNED SILICIDED MOS TRANSISTOR WITH A LIGHTLY DOPED DRAIN BALLAST RESISTOR FOR ESD PROTECTION

[75] Inventor: Shye-Lin Wu, Hsinchu, Taiwan

[73] Assignee: Texas Instruments - Acer Incorporated, Hsinchu, Taiwan

[21] Appl. No.: 08/990,167

[22] Filed: Dec. 12, 1997

[51] Int. Cl.[7] .................. H01L 21/8234; H01L 21/336
[52] U.S. Cl. ................. 438/238; 438/382; 438/281; 438/275; 438/383
[58] Field of Search .................. 438/238, 275, 438/281, 382, 383

[56] References Cited

U.S. PATENT DOCUMENTS

| | | |
|---|---|---|
| 5,246,872 | 9/1993 | Mortensen . |
| 5,374,565 | 12/1994 | Hsue et al. . |
| 5,416,036 | 5/1995 | Hsue . |
| 5,498,892 | 3/1996 | Walker et al. . |
| 5,516,717 | 5/1996 | Hsu . |
| 5,559,352 | 9/1996 | Hsue et al. . |
| 5,585,299 | 12/1996 | Hsu . |
| 5,672,527 | 9/1997 | Lee . |
| 5,712,200 | 1/1998 | Jiang .................... 438/238 |
| 5,837,592 | 11/1998 | Chang et al. ............ 438/382 |
| 5,893,733 | 4/1999 | Yee ....................... 438/238 |

OTHER PUBLICATIONS

P. Fornara et al., Modeling of Local Reduction in TiSi$_2$ and CoSi$_2$ Growth Near Spacers in MOS Technologies: Influence of Mechanical Stress and Main Diffusing Species, 1996 IEEE, pp. 73–76.

Ajith Amerasekera, Correlating Drain Junction Scaling Salicide Thickness, and Lateral NPN Behavior, with the ESD/EOS Perforance of a 0.25 μm CMOS Process, 1996 IEEE, pp. 893–896.

*Primary Examiner*—Richard Booth
*Attorney, Agent, or Firm*—Harness, Dickey & Pierce, P.L.C.

[57] ABSTRACT

A MOS transistor with a self-aligned silicide and a lightly doped drain ballast resistor for ESD protection on a semiconductor substrate is formed with the method in the present invention. The ESD protection devices in a ESD protective region are formed at the same time with the forming of the NMOS, PMOS, or both in a functional region. The transistors with a lightly doped drain (LDD) structure and an ultra-shallow junction can be manufactured. The short channel effect and it's accompanying hot carrier effect is eliminated. ESD damage from external connections to the integrated circuits are kept from the densely packed devices. The self-aligned silicide (salicide) technology employed in the present invention for forming low resistance contacts provides high operation speed with low heat generation. Integrated circuits with ESD hardness and high circuit operation speed of the functional devices are provided by the semiconductor manufacturing process employing the method disclosed.

24 Claims, 4 Drawing Sheets

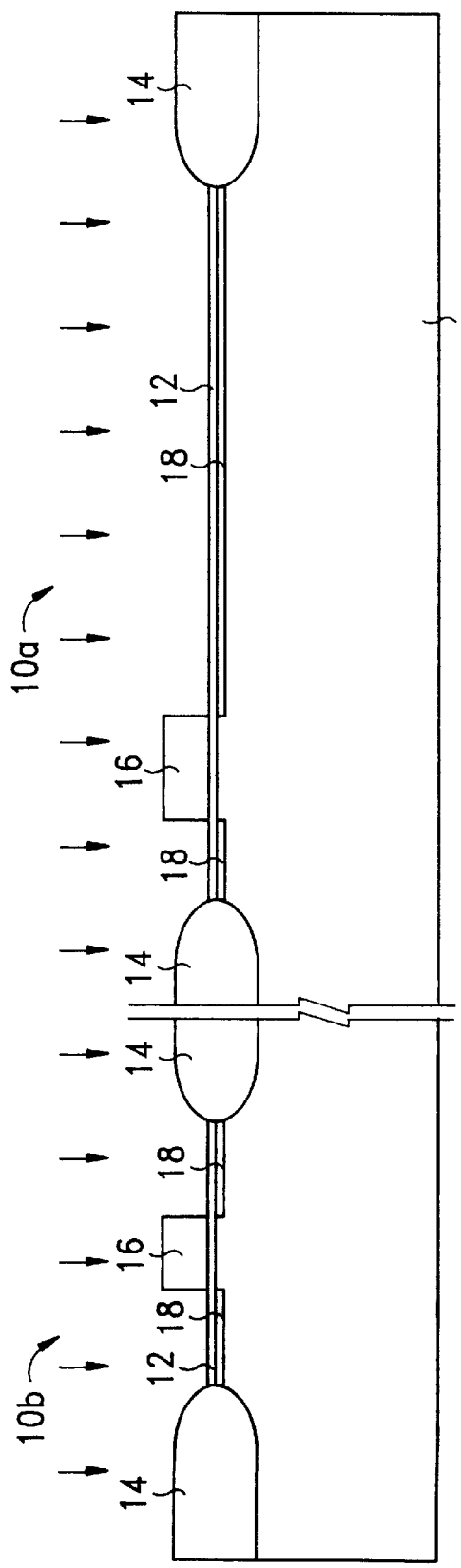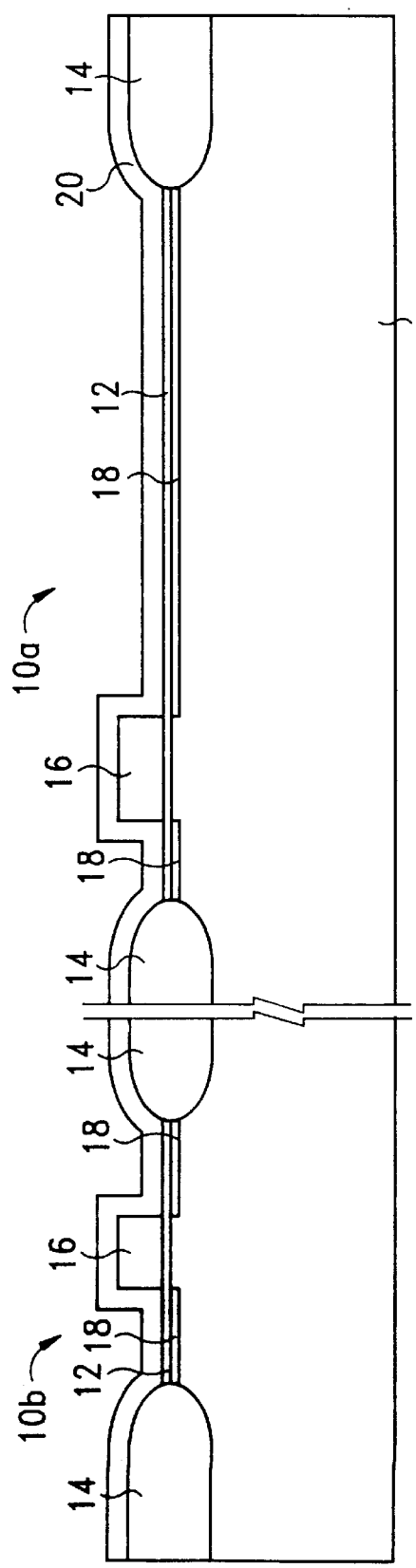

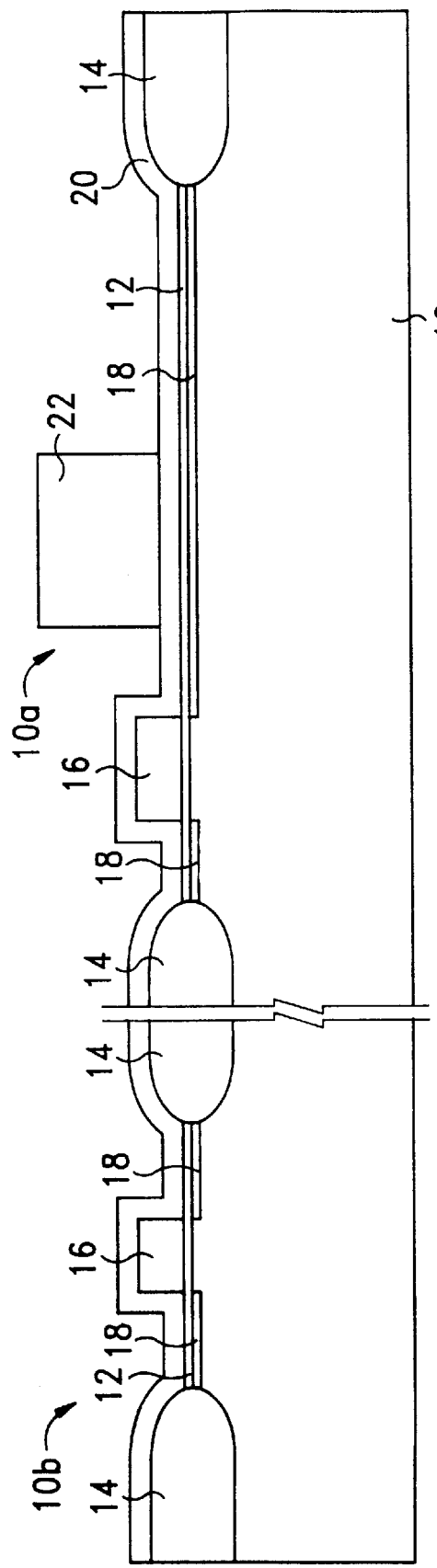
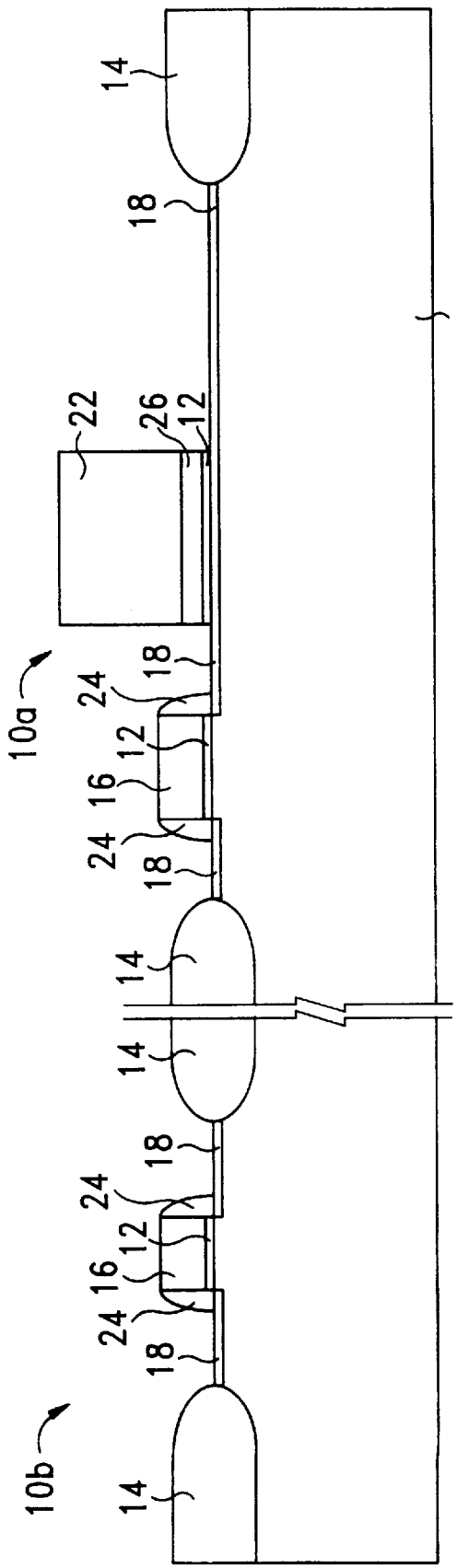

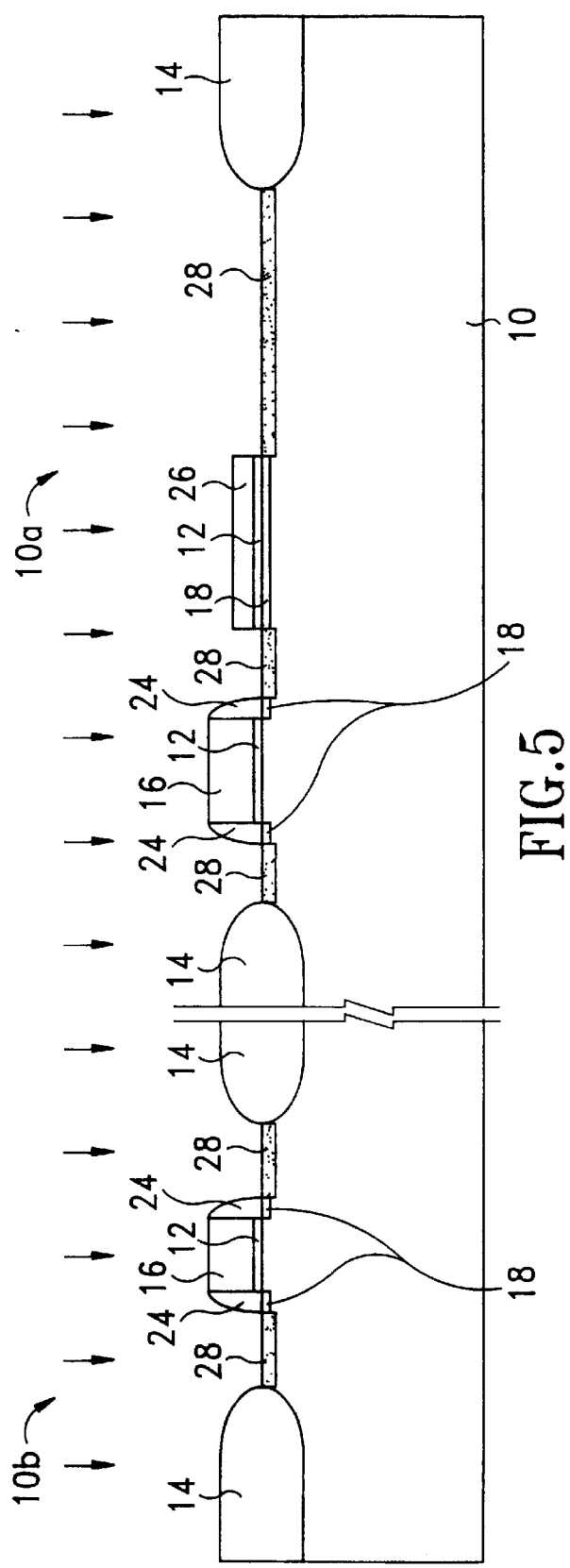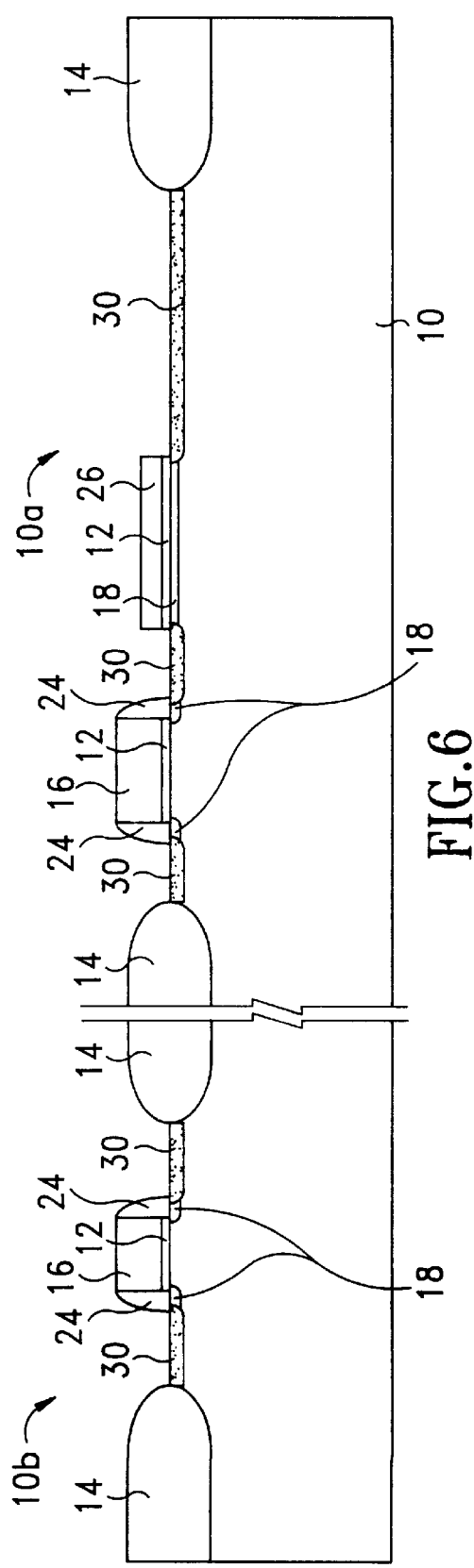

SELF-ALIGNED SILICIDED MOS TRANSISTOR WITH A LIGHTLY DOPED DRAIN BALLAST RESISTOR FOR ESD PROTECTION

FIELD OF THE INVENTION

The present invention relates to the transistors in semiconductor manufacturing, and more specifically, to a method of forming a MOS (metal oxide semiconductor) transistor with a self-aligned silicide and a lightly doped drain ballast resistor for ESD protection in the semiconductor manufacturing processes.

BACKGROUND OF THE INVENTION

With the progress in the semiconductor integrated circuits, from LSI (large scale integration), VLSI (very large scale integration), to ULSI (ultra large scale integration), the integrity of the integrated circuits rises in an amazing rate. Taking DRAM (dynamic random access memories) for example, the increasing integrity in manufacturing extends the capacity of a single chip to step from earlier 4 megabit to 16 megabit, and further to 256 megabit or even higher. Integrated circuits devices like transistors, capacitors, and connections must be greatly narrowed accompanying with the advancement. The increasing packing density of integrated circuits generates numerous challenges to the semiconductor manufacturing process. Every element or device needs to be formed within smaller area without influencing the characteristics and operations of the integrated circuits. The demands on high packing density, low heat generation, and low power consumption devices with good reliability and operation life must be maintained without any degradation. These achievements are expected to be reached with the simultaneous developments and advancements in photography, etching, deposition, ion implantation, and thermal processing technologies, the big five aspects of semiconductor manufacturing. The present technology research focus mainly on the sub-micron and one-tenth-micron semiconductor devices to manufacture high reliable and densely arranged integrated circuits.

Transistors, or more particularly metal oxide semiconductor (MOS) transistors, are the most important and frequently utilized devices in integrated circuits. However with the continuous narrowing of device size, the sub-micron scale MOS transistors have to face so many risky challenges. As the MOS transistors become narrower and thinner accompanying with shorter channels, problems like junction punchthrough, leakage, and contact resistance cause the reduction in the yield and reliability of the semiconductor manufacturing processes. The technologies like self-aligned silicide (salicide) and shallow junctions are utilized in combating the undesirable effects to manufacture densely packing devices with good yield.

The electrostatic discharge (ESD) attacking has became a serious problem as the feature size of the MOS transistors scales down. A semiconductor device having input/output pad connections with external circuitry and devices is subject to the problem of the ESD. The ESD is easily conducted through the input/output and power lead connections into the internal devices and causes some problems to the semiconductor devices, especially serious ones like the gate oxide breakdown and the overheat damages. The high voltage gradient generated between the contacts and the channels from the ESD causes the gate oxide electron injection and the carrier acceleration effect in the channels. The characteristics and operations of the devices are easily influenced by the inducing effects of the ESD. High levels of ESD with several hundred volts to a few thousand volts, which are easily transferred to the pins of an IC package during normal handling, can bring permanent destruction to the internal devices. For preventing the devices from ESD damaging, a built-in ESD protection circuits are connected between the input/output pads and internal circuitry. High level of abnormal discharge conducted into the pins of an IC package is kept out by the ESD protection circuits from flowing into the devices. The discharges are guided through the ESD protection circuits to the ground and the damage to the semiconductor devices is eliminated.

Several improvements in combating the ESD problem by forming the ESD protection devices have been provided previously. For example, U.S. Pat. No. 5,559,352 to C. C. Hsue and J. Ko disclosed a method of forming an ESD protection device with reduced breakdown voltage. Their invention employed an lightly implanted region of opposite conductivity type with the source/drain regions centered under the heavier implanted source/drain region. As another example, U.S. Pat. No. 5,498,892 to J. D. Walker and S. C. Gioia disclosed a lightly doped drain ballast resistor. A field effect transistor with an improved electrostatic discharge (ESD) protection using a ballast resistor in the drain region is identified. The ballast resistor laterally distributes current along the width of the drain during an ESD pulse, which reduces local peak current density and reduces damage. But the operation speed problem with small feature size devices is still not solved. In addition, for applying most of the improvements, great efforts are needed with the variations needed in the semiconductor manufacturing circuits and the costs is increased.

In manufacturing the sub-micron feature size semiconductor devices, the salicide technology is a vital application to improve the operation speed of the ULSI/VLSI MOS devices. Unfortunately, there exists some trade-offs in employing the technologies like self-aligned silicide when facing the ESD problem. The devices with the self-aligned silicided contacts shows a worse ESD performance than the non-silicided devices. In general, thicker salicide has a negative effect on the ESD protections and makes the semiconductor devices to be more sensitive to the ESD voltage and to be damaged easily. The details are explored by the investigation of A. Amerasekera et al. ("Correlating Drain Junction Scaling, Salicide Thickness, and Lateral NPN behavior with the ESD/EOS Performance of a 0.25 µm CMOS Process.", IEDM Tech. Dig., p. 893, IEEE 1996) Their investigation presents the physical mechanisms involved in the degradation of ESD performance with shallower junctions, thicker salicides, and different epitaxial thicknesses. The ESD challenge of salicide technology with the smaller scale devices can be clearly understood by referencing their work.

SUMMARY OF THE INVENTION

A MOS transistor with a self-aligned silicide and a lightly doped drain ballast resistor for ESD protection on a semiconductor substrate is formed with the method in the present invention. The ESD protection devices in a ESD protective region are formed at the same time with the forming of the NMOS, PMOS, or both in a functional region. The transistors with a lightly doped drain (LDD) structure and an ultra-shallow junction can be manufactured. The short channel effect and it's accompanying hot carrier effect is eliminated. Undesirable high voltage discharges as high as several thousand volts can conducted to the ground through the substrate by the ESD protective MOS transistor with a lightly doped drain ballast resistor region. The transistors in both the ESD protective region and the functional region with a lightly doped drain (LDD) structure and an ultra-shallow junction can be manufactured. The hot carrier effect accompanying with short channels can be eliminated. Low resistance contacts and interconnections are formed by a self-aligned silicide (salicide) technology in achieving high operation speed with low heat generation and power consumption.

The method of forming a MOS transistor in a semiconductor substrate with the self-aligned silicide and a lightly doped drain ballast resistor for ESD protection includes following steps. At first, an isolation region is formed in a semiconductor substrate. The isolation separates the semiconductor substrate into an ESD protective region for one or more transistors, and a functional region for the integrated circuit devices. Then a gate insulator layer is formed on both the ESD protective region and the functional region. A polysilicon layer is formed above and following the formation of the gate insulator layer. The polysilicon layer is then patterned to form a gate structure. The semiconductor substrate is doped with a first concentration of a first dopant type using the gate structure as a first doping mask. The doping creates a lightly doped active region with dopants both in the ESD protective region and in the functional region.

Then an insulator layer is formed over the semiconductor substrate and the gate structure. An resistor pattern is defined on the ESD protective region by forming and patterning a photoresist layer. Then the removing a portion of the insulating layer and of the gate insulator layer utilizing the photoresist layer as a mask forms a spacer structure surrounding the gate structure and a resistor region under the resistor pattern on the ESD protective region. After that, the semiconductor substrate is doped with a second concentration of the first dopant type using the spacer structure, the gate structure, and the resistor region as a second doping mask. The doping inserts a plurality of dopants into the active region of the ESD protective region and the functional region. Then a first thermal annealing is performed to the semiconductor substrate to drive in and activate the plurality of dopants, to form a shallow junction region in a source region and a drain region of the ESD protective region and the functional region. A metal layer is then formed onto the semiconductor substrate. A second thermal annealing is performed to the semiconductor substrate to form a metal silicide layer on the top surface of the gate structure, the top surface of the source region and the top surface of the drain region, and to leave an unreacted metal layer on the isolation region, the spacer structure, and the resistor region. Finally, the unreacted metal layer is removed from the isolation region, the spacer structure, and the resistor region to finish the manufacturing processes.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein:

FIG. 1 illustrates a cross sectional view of the semiconductor substrate with an isolation region, a gate insulator layer and a gate structure on both the ESD protective region and the functional region in the present invention.

FIG. 2 illustrates a cross sectional view of the semiconductor substrate with the formation of an insulator layer on the a semiconductor substrate in the present invention.

FIG. 3 illustrates a cross sectional view of the semiconductor substrate with the defining of an resistor pattern on the ESD protective region by forming and patterning a photoresist layer in the present invention.

FIG. 4 illustrates a cross sectional view of the semiconductor substrate with the removing of a portion of the insulating layer and of the gate insulator layer to form a spacer structure and a resistor region in the present invention.

FIG. 5 illustrates a cross sectional view of the semiconductor substrate under the doping with a second concentration of the first dopant type to insert a plurality of dopants into the active region in the present invention.

FIG. 6 illustrates a cross sectional view of the semiconductor substrate after a first thermal annealing in the present invention.

DETAILED DESCRIPTION OF THE PREFERRED EMBODIMENT

Figure 7:
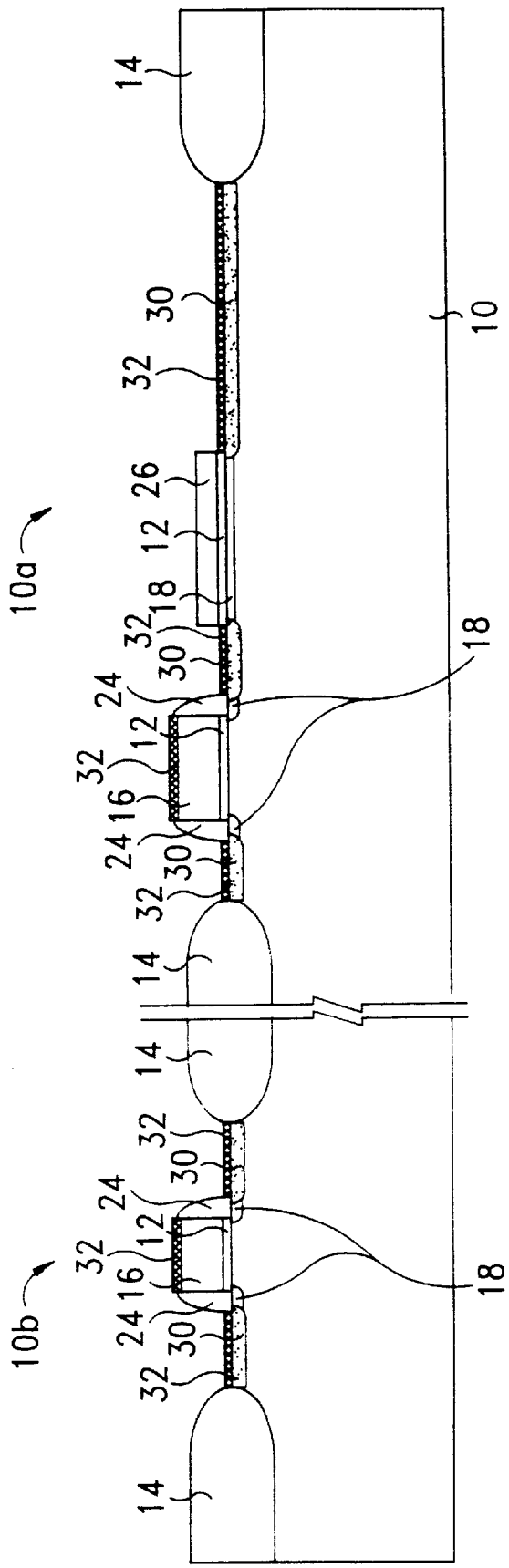
FIG. 7 illustrates a cross sectional view of the semiconductor substrate having a MOS transistor with a self-aligned silicide and a lightly doped drain ballast resistor for ESD protection in the present invention.

A method of forming a MOS transistor with a self-aligned silicide and a lightly doped drain ballast resistor for ESD protection in the semiconductor manufacturing processes is provided in the present invention. The ESD protection MOS transistor with a lightly doped drain ballast resistor region in a ESD protective region conducts the undesirable high voltage discharge to the ground through the substrate. The NMOS, PMOS, or both kind of transistors can be formed simultaneously in a functional region by the method disclosed. The transistors in both the ESD protective region and the functional region with a lightly doped drain (LDD) structure and an ultra-shallow junction can be manufactured. The hot carrier effect accompanying with the short channels can be eliminated. The self-aligned silicide (salicide) technology employed in the present invention for forming low resistance contacts provides high operation speed with low heat generation and power consumption. The method for forming the small feature size devices like sub-micron scale devices overcoming present ESD challenges under the salicide technology is described as following.

As mentioned above, the method and the steps in the present invention applied on a semiconductor wafer can create the NMOS and the MOS for ESD protection at the same time. The PMOS can also be build with the variation in the processes which are well known in the art and thus is not described. Referring to FIG. 1, a semiconductor substrate 10 with a preferable single crystalline silicon in a <100> direction is provided. An isolation region, like field oxide (FOX) region 14, is formed on the semiconductor substrate. In general, a thin silicon oxide layer 12, as a gate insulator layer, is thermally grown on the semiconductor substrate 10 with the thickness of about 20 Å (angstroms) to 300 Å. A silicon nitride layer is then deposited thereon and utilized as a layer for inhibiting the FOX growth on an active region of the semiconductor substrate. The silicon nitride layer is then patterned to etch off the region for forming FOX. The semiconductor substrate is subjected to a thermal process in a steam and oxygen containing ambient to grow the uncovered region of the silicon oxide layer 12 to the FOX region 14 as an isolation region. The FOX region 14 separates the semiconductor substrate into an ESD protective region 10a for one or more transistors and a functional region 10b for a plurality of integrated circuit devices. The silicon nitride layer is than removed using etchants like hot phosphoric acid solution. The isolation region can be created through various different technologies which are known in the art, like trench isolation, with the same purpose in defining respective active regions.

A polysilicon layer is then deposited with the thickness of about 1,000 Å (angstroms) to 4,000 Å onto the semiconductor substrate 10. The example like a low pressure chemical deposition (LPCVD) process can be applied in forming the polysilicon layer. Then a patterning process is performed to define a polysilicon structure 16 on both the ESD protective region 10a and the functional region 10b, as shown in FIG. 1. The patterning of the polysilicon layer can be achieved with an anisotropic etching using an etchant with the great variety of choices like $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$. A doping process to the semiconductor substrate with a first concentration of a first dopant type is performed using the gate structure 16 as a first doping mask. A lightly doped active region 18 in the ESD protective region 10a and the functional region 10b is created employing the process like the ion implantation of phosphorous or arsenic at an energy between about 10 KeV to 100 KeV, to have a dose between about 1E12 to 1E14 atoms/cm$^2$.

Referring to FIG. 2, an insulator layer 20 is formed over the semiconductor substrate 10 and conformal to the gate structure 16. In the case, a silicon oxide layer is deposited by chemical vapor deposition (CVD) with a thickness of about 1,000 Å (angstroms) to 2,000 Å. Then a lithography process employing a series of processes like forming, defining, and etching of a photoresist layer 22 is employed to define a resistor pattern on the insulator layer 20 of the ESD protective region 10a, as shown in FIG. 3, aside from the gate structure 16. Using the photoresist layer 22 as a mask, a portion of the insulating layer 20 and of the gate insulator layer 12 is etched off. The residue part of the silicon dioxide forms a spacer structure 24 surrounding the gate structure 16, and a resistor region 26 located aside the spacer structure 24 on the ESD protective region, as shown in FIG. 4. The removing of a portion of the insulating layer 20 and the gate insulator layer 12 is performed via an etchant like $CF_4$, $CCl_2F_2$, $CHF_3/CF_4$, $CHF_3/O_2$, $CH_3CHF_2$ in an anisotropic etching process. The drain region of the ESD protective region 10a is divided into two parts by the resistor region 26.

Referring to FIG. 5., a doping process is performed to the semiconductor substrate 10 with a second concentration of the first dopant type. Using the spacer structure 24, the gate structure 16, and the resistor region 26 as a mask, a process like an ion implantation of phosphorous or arsenic at an energy between about 5 KeV to 80 KeV, to have a dose between about 5E14 to 2E16 atoms/cm$^2$ is employed. The doping of the uncovered region on both the ESD protective region 10a and the functional region 10b forms an active region 28 containing ions for forming a source region and a drain region on the semiconductor substrate 10. Referring to FIG. 6, a thermal annealing process is performed to the semiconductor substrate 10 to drive in and activate the containing ions in the active region 28. An ultra-shallow junction 30 is formed in the active regions like a source region and a drain region in both the ESD protective region 10a and the functional region 10b.

Finally, a self-aligned silicide (salicide) technology is utilized to complete the method of the present invention. A metal layer is formed on the semiconductor substrate using the method like the chemical vapor deposition or the sputtering generally with a thickness of about 100 Å (angstroms) to 1000 Å. A metal like Ti, Co, W, and Pt can be used as the material of the metal layer. Then a thermal annealing process, preferably a rapid thermal process (RTP) in a nitrogen ambient with a temperature of about 600° C. to 1000° C., is performed to the semiconductor substrate 10. A metal silicide layer 32 is formed on the top surface of the gate structure 16, the top surface of the source region and the top surface of the drain region. An unreacted metal layer is left on the isolation region 14, the spacer structure 24, and the resistor region 26. The unreacted metal layer are then removed from the isolation region 14, the spacer structure 24, and the resistor region 26 to finish the salicidation process. The removing of the unreacted metal layer can be achieved by an wet etching using a solution containing $NH_4OH$, $H_2O$, and $H_2O_2$. With the resistor region 26 on the ESD protective region 10a, the metal silicide layer 32 can be formed without degrading the ESD protection effect of the circuits. The contact resistance of the interconnections of the integrated circuits is greatly reduced in both the ESD protective region 10a and the functional region.

For a detailed understanding of the self-aligned silicide technology, the modeling made by P. Fornara and A. Poncet ("Modeling of Local Reduction in $TiSi_2$ and $CoSi_2$ Growth Near Spacers in MOS Technologies: Influence of Mechanical Stress and Main Diffusing Species", IEDM Tech. Dig., P. 73, 1996) can be referenced. A comprehensive silicide growth model is developed in identifying the influence of the main diffusing species and mechanical stresses.

A MOS transistor on a semiconductor substrate with a self-aligned silicide and a lightly doped drain ballast resistor for ESD protection is formed with the method of the present invention. The ESD protection devices in the ESD protective region can be formed simultaneously with the NMOS, the PMOS, or both kinds of devices in the functional region, with only the addition of one lithography process or the variation in the mask of the already existed processes. The lithography process in defining the ballast resistor region of the MOS transistor for ESD protection is quite cost efficient compared to the advantages addressed. Undesirable high voltage discharges as high as several thousand volts can conducted to the ground by the ESD protective MOS transistor with a lightly doped drain ballast resistor region. The transistors in both the ESD protective region and the functional region with a lightly doped drain (LDD) structure and an ultra-shallow junction can be manufactured. The hot carrier effect accompanying with the short channels can be eliminated. The low resistance contacts and interconnections are formed by a self-aligned silicide (salicide) technology in achieving high operation speed with low heat generation and power consumption.

As is understood by a person skilled in the art, the foregoing description of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a MOS transistor in a semiconductor substrate, said method comprising the steps of:

forming an isolation region in said semiconductor substrate, said isolation region separating said semiconductor substrate into an ESD protective region for at least one transistor and a functional region for a plurality of integrated circuit devices;

forming a gate insulator layer on said ESD protective region and said functional region;

forming a polysilicon layer on said gate insulator layer;

patterning said polysilicon layer to form a gate structure;

doping said semiconductor substrate with a first concentration of a first dopant type using said gate structure as a first doping mask, for forming a lightly doped active region in said ESD protective region and in said functional region;

forming an insulator layer over said semiconductor substrate and said gate structure;

defining a resistor pattern located aside said gate structure on said ESD protective region by forming and patterning a photoresist layer;

removing a portion of said insulating layer and of said gate insulator layer utilizing said photoresist layer as a mask, for forming a spacer structure surrounding said gate structure and for forming a resistor region under said resistor pattern on said ESD protective region;

removing said photoresist layer;

doping said semiconductor substrate with a second concentration of said first dopant type using said spacer structure, said gate structure, and said resistor region as a second doping mask, for placing a plurality of dopants in an active region of said ESD protective region and said functional region;

first thermal annealing said semiconductor substrate to drive in and activate said plurality of dopants, to form a shallow junction region in a source region and a drain region of said ESD protective region and said functional region;

forming a metal layer on said semiconductor substrate;

second thermal annealing said semiconductor substrate to form a metal silicide layer on a top surface of said gate structure, a top surface of said source region and a top surface of said drain region, and to leave an unreacted metal layer on said isolation region, said spacer structure, and said resistor region; and removing said unreacted metal layer from said isolation region, said spacer structure, and said resistor region.

2. The method of claim 1, wherein said isolation region comprises a field oxide isolation, said field oxide isolation being formed by the growth of a portion of said semiconductor substrate, to separate said semiconductor substrate into said ESD protective region and said functional region.

3. The method of claim 1, wherein said step of doping with said first concentration of said first dopant type is performed by a first ion implanting process of a plurality of ions, and said step of doping with said second concentration of said first dopant type is performed by a second ion implanting process of said plurality of ions, said first dopant type is selected from the group consisting of an arsenic containing dopant and a phosphorous containing dopant.

4. The method of claim 3, wherein said first ion implanting process of said plurality of ions is implanted at an energy between about 10 KeV to 100 KeV at a dose between about 1E12 to 1E14 atoms/cm$^2$.

5. The method of claim 4, wherein said second ion implanting process of said plurality of ions is implanted at an energy between about 5 KeV to 80 KeV at a dose between about 5E14 to 2E16 atoms/cm$^2$.

6. The method of claim 1, wherein said gate insulator layer comprises a silicon oxide which is grown thermally in an oxygen ambient on said semiconductor substrate to a thickness of about 20 Å (angstroms) to 300 Å.

7. The method of claim 1, wherein said polysilicon layer is deposited in a chemical vapor deposition process with a thickness of about 1,000 Å (angstroms) to 4,000 Å.

8. The method of claim 1, wherein said step of patterning said polysilicon layer is achieved with an anisotropic etching using an etchant which is selected from the group of $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

9. The method of claim 1, wherein said step of removing a portion of said insulating layer and said gate insulator layer is performed with an etchant which is selected from the group of $CF_4$, $CCl_2F_2$, $CHF_3/CF_4$, $CHF_3/O_2$, $CH_3CHF_2$ in an anisotropic etching.

10. The method of claim 1, wherein said insulating layer comprises a silicon oxide layer which is deposited with a thickness of about 1,000 Å (angstroms) to 2,000 Å.

11. The method of claim 1, wherein said metal layer comprises a metal selected from the group consisting of Ti, Co, W, and Pt.

12. The method of claim 1, wherein said step of second thermal annealing for forming a metal silicide layer is performed with a rapid thermal process in a nitrogen ambient with a temperature of about 600° C. to 1000° C.

13. The method of claim 1, wherein said step of removing said unreacted metal layer from said isolation region, said spacer structure, and said resistor region is achieved by the wet etching of a solution containing $NH_4OH$, $H_2O$, and $H_2O_2$.

14. A method of forming a MOS transistor in a semiconductor substrate, said method comprising the steps of:

forming an isolation region in said semiconductor substrate, said isolation region comprising a field oxide isolation being formed by the growth a portion of said semiconductor substrate, to separate said semiconductor substrate into an ESD protective region for at least one transistor and a functional region for a plurality of integrated circuit devices;

forming a gate insulator layer on said ESD protective region and said functional region;

forming a polysilicon layer on said gate insulator layer;

patterning said polysilicon layer to form a gate structure;

doping said semiconductor substrate with a first concentration of a first dopant type using said gate structure as a first doping mask, for forming a lightly doped active region in said ESD protective region and in said functional region;

forming an insulator layer over said semiconductor substrate and said gate structure;

defining a resistor pattern located aside said gate structure on said ESD protective region by forming and patterning a photoresist layer;

removing a portion of said insulating layer and of said gate insulator layer utilizing said photoresist layer as a mask, for forming a spacer structure surrounding said gate structure and for forming a resistor region under said resistor pattern on said ESD protective region;

removing said photoresist layer;

doping said semiconductor substrate with a second concentration of said first dopant type using said spacer structure, said gate structure, and said resistor region as a second doping mask, for placing a plurality of dopants in an active region of said ESD protective region and said functional region;

first thermal annealing said semiconductor substrate to drive in and activate said plurality of dopants, to form a shallow junction region in a source region and a drain region of said ESD protective region and said functional region;

forming a metal layer on said semiconductor substrate, said metal layer being a metal selected from the group consisting of Ti, Co, W, and Pt;

second thermal annealing said semiconductor substrate to form a metal silicide layer on a top surface of said gate structure, a top surface of said source region and a top surface of said drain region, and to leave an unreacted metal layer on said isolation region, said spacer structure, and said resistor region; and removing said unreacted metal layer from said isolation region, said spacer structure, and said resistor region.

15. The method of claim 14, wherein said step of doping with said first concentration of said first dopant type is performed by a first ion implanting process of a plurality of ions, and said step of doping with said second concentration of said first dopant type is performed by a second ion implanting process of said plurality of ions, said first dopant type is selected from the group consisting of an arsenic containing dopant and a phosphorous containing dopant.

16. The method of claim 15, wherein said first ion implanting process of said plurality of ions is implanted at an energy between about 10 KeV to 100 KeV at a dose between about 1E12 to 1E14 atoms/cm$^2$.

17. The method of claim 16, wherein said second ion implanting process of said plurality of ions is implanted at an energy between about 5 KeV to 80 KeV at a dose between about 5E14 to 2E16 atoms/cm$^2$.

18. The method of claim 14, wherein said gate insulator layer comprises a silicon oxide which is grown thermally in an oxygen ambient on said semiconductor substrate to a thickness of about 20 Å (angstroms) to 300 Å.

19. The method of claim 14, wherein said polysilicon layer is deposited in a chemical vapor deposition process with a thickness of about 1,000 Å (angstroms) to 4,000 Å.

20. The method of claim 14, wherein said step of patterning said polysilicon layer is achieved with an anisotropic etching using an etchant which is selected from the group of $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

21. The method of claim 14, wherein said step of removing a portion of said insulating layer and said gate insulator layer is performed with an etchant which is selected from the group of $CF_4$, $CCl_2F_2$, $CHF_3/CF_4$, $CHF_3/O_2$, $CH_3CHF_2$ in an anisotropic etching.

22. The method of claim 14, wherein said insulating layer comprises a silicon oxide layer which is deposited with a thickness of about 1,000 Å (angstroms) to 2,000 Å.

23. The method of claim 14, wherein said step of second thermal annealing for forming a metal silicide layer is performed with a rapid thermal process in a nitrogen ambient with a temperature of about 600° C. to 1000° C.

24. The method of claim 14, wherein said step of removing said unreacted metal layer from said isolation region, said spacer structure, and said resistor region is achieved by the wet etching of a solution containing $NH_4OH$, $H_2O$, and $H_2O_2$.

* * * * *